United States Patent [19]
Pass

[11] 3,995,228
[45] Nov. 30, 1976

[54] ACTIVE BIAS CIRCUIT FOR OPERATING PUSH-PULL AMPLIFIERS IN CLASS A MODE

[75] Inventor: Nelson S. Pass, Sacramento, Calif.

[73] Assignee: Threshold Corporation, Sacramento, Calif.

[22] Filed: Sept. 26, 1975

[21] Appl. No.: 616,901

[52] U.S. Cl. .............................. 330/13; 330/15; 330/18; 330/19; 330/22; 330/30 D; 330/40
[51] Int. Cl.² ........................................ H03F 3/183
[58] Field of Search .................. 330/13, 15, 17, 22, 330/40, 30 D, 18, 19

[56] References Cited
UNITED STATES PATENTS

| | | |
|---|---|---|
| 3,536,958 | 10/1970 | Sondermeyer .................. 330/13 X |
| 3,866,134 | 2/1975 | Higuchi et al. ........................ 330/22 |

*Primary Examiner*—James B. Mullins
*Attorney, Agent, or Firm*—Thomas Schneck, Jr.

[57] ABSTRACT

A transistor audio amplifier of the Class AB complementary symmetry type is biased with a new bias circuit to keep both transistors on during all normal signal conditions. The bias circuit includes a pair of series connected $V_{BE}$ Multipliers with an interconnection between the two multipliers receiving signal feedback from the amplifier output such that the Multipliers can bias both complementary transistors on for all normal signal operating conditions.

7 Claims, 9 Drawing Figures

ACTIVE BIAS CIRCUIT FOR OPERATING PUSH-PULL AMPLIFIERS IN CLASS A MODE

BACKGROUND OF THE INVENTION

1. Field of the Invention

The invention relates to high fidelity audio amplifiers and more particularly to an active bias circuit for achieving essentially Class A operation in push-pull transistor amplifiers.

2. Prior Art

Low distortion, wide bandwidth, high power, and unconditional stability are the most important performance features desired in high fidelity power amplifiers. Present solid-state designs easily attain 100 watts over bandwidths greater than 20 to 20,000 hertz with less than 0.1% total rated harmonic or intermodulation distortion. However, many amplifiers which meet such specifications sound poorer than amplifiers with nearly identical specifications or even older devices with 5 times more rated distortion.

Part of the problem arises because of the rating method. Distortion and power tests are invariably made into resistive loads, usually eight ohms, while actual speaker systems have resistive, reactive and dynamic impedance components. Amplifiers generally have poorer distortion features into reactive and dynamic loads, and especially poorer figures into capacitive loads.

Distortion is usually computed by taking the square root of the sum of the squares of the amplitude of each harmonic. Thus, the total figure does not reveal the distribution of distortion components. It is well known that it is desirable to concentrate distortion second and third harmonics where it can be masked by the harmonic content of the program. Harmonics greater than third order harmonics are less subtle and create a harsh quality to the audio output.

Lower order harmonics are caused by gradual or "smooth" non-linearities in the amplifying system, whereas higher order harmonics are caused by more abrupt non-linearities. Thus, to avoid higher order harmonics, abrupt non-linearities must be eliminated. Most solid-state audio equipment, while having very low total harmonic distortion, is often characterized by many higher order distortion components, resulting in what is known as "transistor-sound". Older tube amplifiers, while having higher distortion, have the distortion in lower order harmonics and such tube equipment characterized by "tube sound", is preferable to many audiophiles, for all of the drawbacks in tube type equipment.

The abrupt non-linearities in the characteristic curves of transistor amplifiers arise primarily because of what is known as "cross-over distortion". Cross-over distortion arises in Class B, push-pull amplifiers. This is an amplifier type using two complementary transistors, often arranged in an emitter follower configuration. For example, see "Electronic Devices and Circuits" by Jacob Millman and Christos Halkins, McGraw-Hill, 1967, p. 563, FIG. 18–14, showing a push-pull emitter follower audio output circuit with transistors having complementary symmetry. FIG. 18–15 illustrates cross-over distortion. Professor Millman says that cross-over distortion "may be decreased by biasing the transistors at a higher standby current. A compromise must be made between distortion and efficiency."

The disadvantage of Class B operation can be remedied by utilizing Class A operation in which the operating region of the transistor contains the least abrupt non-linearities. However, the essential disadvantage of Class A circuits is their general inefficiency, since the bias current is usually as great or greater than the peak output current. Thus, most of the power delivered to the circuit is dissipated in the output stage of the amplifier as heat.

Another remedy is to use Class AB operation. In that mode, forward bias is provided to both output transistors in a circuit similar to the complementary symmetry emitter follower described above, when the amplifier is in a quiescent mode. Class AB operation does much to eliminate abrupt crossover non-linearity by maintaining a forward bias across both of the push-pull transistors at output current generally less than the bias current. However, the amount of bias current which can be supplied is limited by thermal dissipation capabilities of the output transistors.

Figure 1:
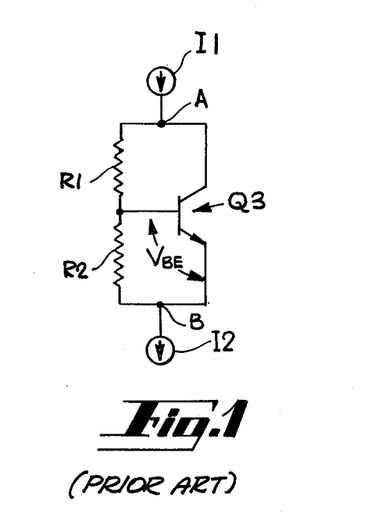
FIG. 1 is a schematic diagram of a bias circuit known as a $V_{BE}$ Multiplier of the prior art.
Figure 2:
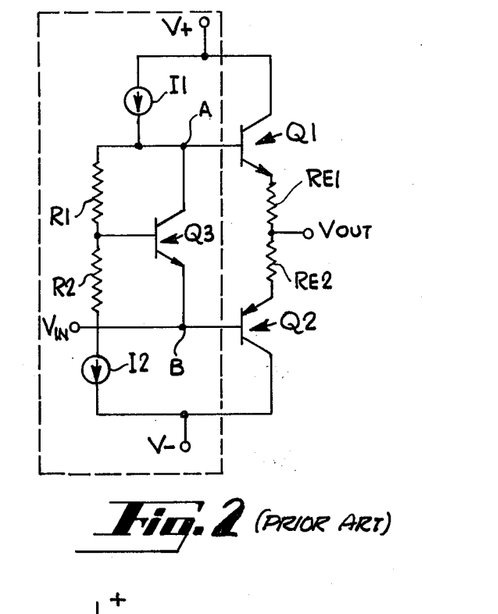
FIG. 2 is a schematic diagram of the $V_{BE}$ Multiplier of the prior art shown in FIG. 1 incorporated in a complementary symmetry emitter follower output circuit in which the $V_{BE}$ Multiplier provides bias for the emitter follower configuration.

In conventional amplifiers using emitter-follower output stages in complementary symmetry, bias current is developed by use of a constant voltage generator whose voltage output is equal to the sum of the forward bias voltage drops of the emitter followers in series plus the IR drops of the series resistances in the bias path, see FIGS. 1 and 2, wherein FIG. 1 shows a constant voltage generator of the prior art and FIG. 2 shows a use of this bias circuit with a complementary symmetry output stage of the prior art.

The apparatus of FIG. 1 generates a relative constant bias voltage, $V_B$, across bias feed nodes A and B:

$$V_B \cong V_{BE} \times \frac{R1 + R2}{R2}$$

This equation is derived by noting the voltage across R2 is equal to $V_{BE}$. The current flowing through R1 is assumed to be the same current flowing through R2, neglecting the small base current of the transistor so that the current through R2 is equal to $V_{BE}/R2$.

The bias transistor, Q2, of a $V_{BE}$ Multiplier is mounted in thermal contact with the output transistors for temperature compensation.

Sometimes the constant voltage generators of the prior art used some form of forward biased diode junction and were designed for minimal bias voltage fluctuation over various dynamic conditions of the output stage of the amplifier. The use of diode junctions allowed good thermal tracking of bias current by placing the constant voltage bias generator in thermal contact with the output transistors.

Although Class AB operation is beneficial and improves the problem of abrupt non-linearities in transistor amplifiers, cross-over distortion is still found and is a higher percentage of the waveform content as power decreases. The cross-over non-linearities still exist when output transistors of the Class AB stage turn on and off. Feedback is used to add still greater linearity to the output.

It is an object of the present invention to build an efficient amplifier using Class AB emitter follower complementary output stages, but eliminating cross-over distortion by operating the circuit in a Class A mode over the entire current and voltage output swing.

SUMMARY OF THE INVENTION

The above object is achieved in an audio amplifier having emitter follower, complementary symmetry, output transistors utilizing a novel active bias circuit connected across bias feed nodes of the output transistors. The active bias circuit includes a pair of $V_{BE}$ Multipliers with a shared voltage divider resistor therebetween and internal voltage reference means connected on a first side to an output node between the two output transistors and on a second side to two internal voltage reference nodes, each associated with a $V_{BE}$ Multiplier. The internal voltage reference means clamps the internal voltage reference nodes with respect to the output node at a voltage level such that the output transistors are forward biased at all times under normal signal conditions. The internal voltage reference means is a pair of constant voltage sources, such as diodes which permit feedback from the output node to permit clamping with respect to the internal voltage reference nodes.

Each $V_{BE}$ Multiplier has a bias transistor with at least one voltage multiplier resistor connected between the base and collector. The two bias transistors in combination with the voltage multiplier resistors provide bias voltage to the output transistors. The level of bias is continuously adjusted by the previously mentioned voltage reference means. The signal level at the output node references the voltage level of each constant voltage source which, in turn, adjusts the bias provided by each $V_{BE}$ Multiplier.

An input signal to the output transistors is provided by a differential input amplifier receiving a first input from an audio source and a second input receiving feedback from the output node. The differential voltage output is then amplified and coupled to the common emitter output stage.

The feedback provided to the input stage and to the active bias circuit maintains circuit operation in the Class A mode. This is achieved by maintaining forward bias on both of the output transistors at all times under normal operating conditions, i.e. during normal audio signal input from such sources as records, tapes, and the like made for high fidelity listening.

DESCRIPTION OF THE PREFERRED EMBODIMENT

The biasing of a Class B amplifier toward Class A conditions is not new. Previously this has been done with a constant voltage generator such as the one illustrated in FIG. 1. The circuit shown in FIG. 1 generates a bias voltage $V_B$ in a circuit known as a $V_{BE}$ Multiplier, previously discussed.

FIG. 2 illustrates a prior art complementary symmetry emitter follower output circuit, specifically the transistors Q1 and Q2 biased by the prior art $V_{BE}$ Multiplier indicated by the dashed lines in FIG. 2.

The transistor Q3 is seen to generate a voltage drop $V_{BE}$ across the base to emitter junction thereof. This voltage is multiplied by the resistance $$\frac{R1 + R2}{R2}$$

and hence the bias voltage $V_B$ is approximately equal to $$V_{BE} \times \frac{R1 + R2}{R2}.$$

A current source I1 is connected to $V_{BE}$ Multiplier for sourcing or supplying current to the circuit while a current sink I2 is provided for sinking current supplied by the source.

Figure 3:
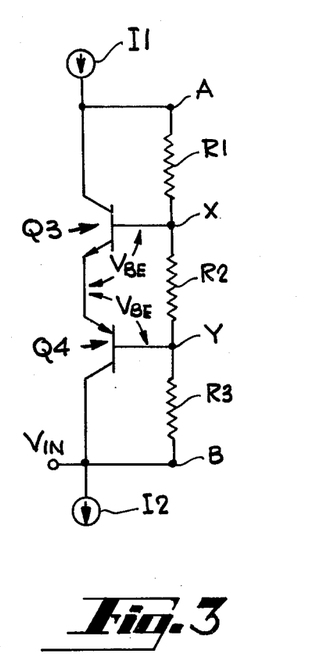
FIG. 3 is a schematic diagram of a bias circuit of the present invention.

In the present invention, an improved bias circuit is provided and is shown in simplified form in FIG. 3. In FIG. 3, a pair of $V_{BE}$ Multipliers has been provided. A first multiplier comprises the bias transistor Q3 and the multiplier resistor R1 while the second multiplier comprises the bias transistor Q4 and the multiplier resistor R3.

The first $V_{BE}$ Multiplier shares a voltage divider resistor R2 with the second $V_{BE}$ Multiplier. The total output voltage across the $V_{BE}$ Multiplier is taken across the output nodes A and B. This bias voltage, $V_B$ is approximately equal to $2V_{BE} \times$ $$2V_{BE} \times \frac{R1 + R2 + R3}{R2}$$

Since R2 appears in the denominator of the equation, it is termed a voltage divider resistor. R2 is shared by each of the two $V_{BE}$ Multipliers which generate $V_B$ across bias feed nodes A and B in the newly provided circuit.

An advantage of the newly provided circuit lies in its symmetry. Because of the shared resistor R2 between the internal voltage reference nodes X and Y, the circuit provides symmetric working access to the bases of the bias transistors Q3 and Q4 as seen in FIG. 4.

Figure 4:
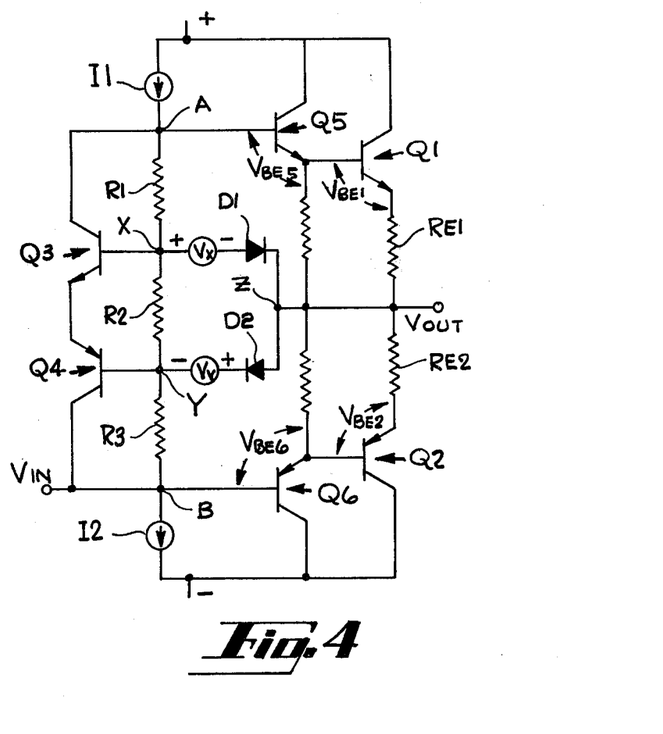
FIG. 4 is a schematic diagram of a complementary symmetry emitter follower audio output circuit utilizing an improved bias circuit of the present invention.

In FIG. 4, the bias transistors, Q3 and Q4 which with their respective multiplier resistors R1 and R3 and the shared divider resistor R2 form the bias circuit for output transistors Q1, Q2 and their respective drivers Q5 and Q6. Bias is provided to the complementary symmetry output transistors Q1 and Q2 through drivers Q5 and Q6 from the bias feed nodes A and B. The internal voltage reference nodes X and Y are referenced to the output node Z of the complementary symmetry emitter follower output circuit. Between the internal voltage reference nodes X and Y on the one hand, and the output node Z on the other hand, constant voltage sources forming an internal voltage reference means are connected. A first constant voltage source comprises the combination of the voltage source $V_X$ and the diode D1 while a second constant voltage source comprises the voltage source $V_Y$ and the diode D2, each voltage source having positive and negative polarities indicated by the plus and minus signs in FIG. 4. D1 and D2 serve to prevent reverse current flow. Thus the bases of Q3 and Q4 are referenced to the output node Z through a constant voltage source. In FIG. 4, the constant voltage sources are formed by diodes in series with transistor forward bias voltages, although alternatively the constant voltage sources may be provided by zener breakdown.

An example of the advantage of a circuit of the present invention may be demonstrated as follows. FIG. 2 shows a prior art complementary symmetry emitter follower output circuit with a bias means of the prior art indicated within the dashed lines. Consider the circuit of FIG. 2 in two typical conditions: (1) $V_{OUT}$ equal to zero and $V_{OUT}$ equal to 10 volts. In the first condition assume that a bias current into the bases of the output transistor is equal to 100 milliamps. If the value of the resistor in the emitter circuit of each output transistor, RE1 and RE2, is 1 ohm, the voltage drop across each such resistor will be 0.1 volt and the approximate base to emitter drop of each output transistor, $V_{BE}$ will equal 0.7 volts so that the total bias voltage across nodes A and B, i.e. across the bases of the output transistor will be, $V_B = 0.7V + 0.7V + 0.1V + 0.1V = 1.6$ Volts.

At the second output condition, a +10 volt output with an output current of 1 ampere assumed, the voltage across one resistor in the emitter circuit of the transistor which is "on" is equal to 1 volt while the base to emitter drop of the same transistor could increase to 0.9 volts. On the other hand, Q2, the transistor which conducting 100 m.a. will have the same base to emitter drop as mentioned in the previous paragraph, or 0.7 volts, while the voltage drop across the resistor in the emitter circuit of that resistor will be 0.1 volts. In this instance the bias voltage, $V_B$, would have to be equal to 1 volt + 0.9 volts + 0.1 volt + 0.7 volts = 2.7 volts.

Thus it is seen that the bias voltage, $V_B$, must increase from 1.6 volts to 2.7 volts to maintain the assumed 100 milliamp forward bias in both output transistors. The bias voltage generator shown in FIG. 2 generates a constant bias voltage $V_B$ approximately equal to $$V_{BE} \times \frac{R1 + R2}{R2}.$$

Now however with the bias current of FIG. 3, the quiescent bias voltage $$V_B = 2 V_{BE} \times \frac{R1 + R2 + R3}{R2}.$$

An advantage of the present invention is the ability to inject and remove currents from the intermediate nodes X and Y. Suppose a small amount of current is injected out of internal reference node X. Since the current through R2 remains constant, additional current flow through R1, causing a voltage increase across R1, and a corresponding increase in the bias voltage, $V_B = V_{R1} + V_{R2} + V_{R3}$. $V_{R3}$ remains constant because the current through R2 is constant and the current in R2 is approximately equal to the current in R3, assuming high current gain for the transistors, such that base currents are reduced essentially to zero.

The same $V_B$ voltage increase will occur across R3 as positive current is injected into node Y. Thus, the present circuit provides a symmetric current controlled amplifier for tracking the bias voltage $V_B$ against the needs of the output stage.

In FIG. 4, the constant voltage sources across nodes X and Z, Y and Z, have a voltage slightly greater than the base to emitter drop, $V_{BE}$ of the transistors Q3 and Q4. Diodes D1 and D2 prevent reverse current flowing into the internal voltage reference nodes X and Y. The total bias voltage, $V_B$, across bias feed nodes A and B, is equal to base to emitter drop $V_{BE}$ across each output transistor, including its driver, if any, plus the voltage drop across each resistor in the emitter circuit of each output transistor, $V_{RE1}$ and $V_{RE2}$. In a quiescent state, the current at nodes X and Y is very small, as is the output current and the output voltage. If as in the previous example, the node X is approximately equal to +0.7 volts and the voltage at node Y is approximately equal to −0.7 volts referenced to output node Z and positive output current is swung by an input signal, the base to emitter voltage of the first output transistor Q1, $V_{BE1}$, $V_{BE5}$ increases, as does the voltage drop across the resistor in the emitter circuit of the same transistor, $V_{RE1}$.

If the voltage across R1 in the new bias circuit, $V_{R1}$, were to stay constant, then the voltage at node X would rise above +0.7 volts above the output voltage, $V_{OUT}$ due to increased $V_{BE1}$, $V_{BE3}$ and $V_{RE1}$ because the latter were in series. However, if the voltage at node X attempts to go higher than the output voltage plus the voltage of $V_X$, current flows from node X to the output, i.e. feedback current, effectively clamping node X at the output voltage plus the voltage at node X, i.e. $V_{OUT} + V_X$, and increasing the current flow through the resistor R1, causing an increase in the bias voltage, $V_B$.

Within limits, voltage across R1 will increase to whatever is required to hold the voltage at node X to approximately $V_{OUT} + V_X$. This function, symmetrical for nodes X and Y and R1 and R3 insures sufficient voltage, $V_B$ to maintain forward bias for the output transistors under all normal operating conditions.

Figure 5:
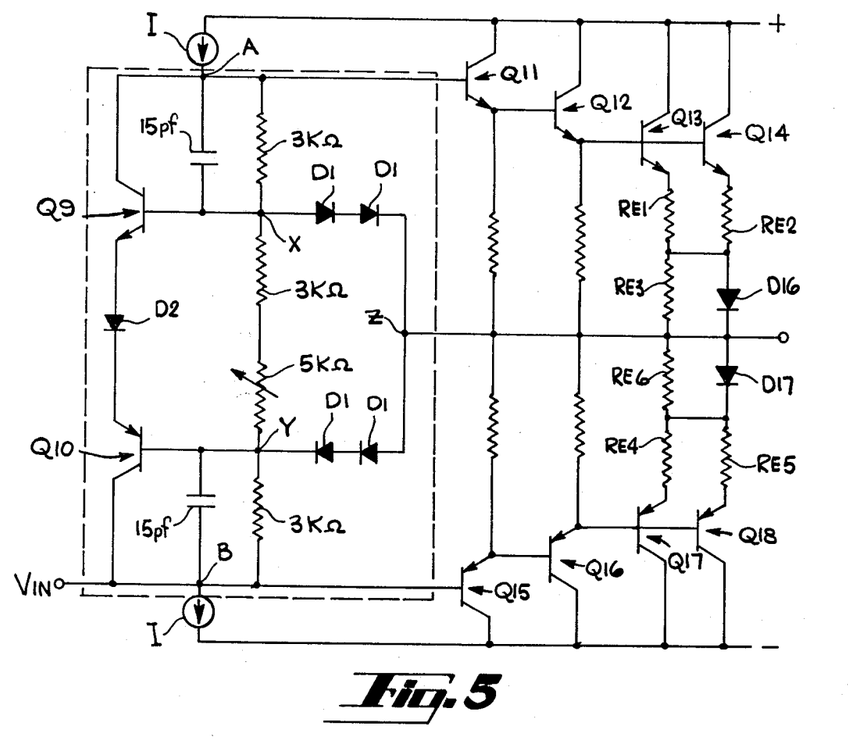
FIG. 5 is a schematic diagram of a more detailed emitter follower complementary symmetry output circuit utilizing an improved bias circuit of the present invention.

FIG. 5 shows a working circuit utilizing the apparatus of this invention. The transistors Q11–Q14 form half of a complementary symmetry emitter follower Darlington output stage with transistors Q15–Q18 forming the other half.

The bias circuit of the present invention is indicated by the dashed line in FIG. 5. The capacitors, C1 and C2 not previously shown in the bias circuit of the present invention have 15 pf capacitance and prevent spurious oscillation at high frequencies in the bias network. These capacitors are not crucial to operation of the circuit. The diodes D11, D12, D13, D14 are used to generate the constant voltage sources previously mentioned between the intermediate output nodes X and Y on the one hand and the output node Z on the other. The diode D15, not previously shown, is used to increase the effective $V_{BE}$ voltages of the bias transistors Q9, Q10. This diode is not crucial.

In the output circuit, the diodes D16, D17 are used to limit the voltage across the resistors and emitter circuits of the output transistors, $V_{RE}$ to about a volt under higher current conditions. The output transistors have as little increase in their required forward bias over their required output range as possible. In other words the required bias voltage for current increases is minimized. Transistors which have this characteristic are exemplified by types 2N5303 and 2N5745.

The bias transistors Q9 and Q10 are preferable matched pairs and are general type signal transistors. Preferably they are brought into thermal contact with output transistors Q13, Q14, Q17 and Q18 for matching temperature performance of each.

It is important that very little current flows through the diodes D11, D12, D13, D14 during quiescent conditions, and the diodes should have a sharp "knee" characteristic in the forward bias voltage to more nearly approximate a constant voltage source. Diodes which have this characteristic are general silicon diodes, like IN914, but selected for sharp knees.

In the circuit of FIG. 5, the forward diodes D16, D17 are across resistors RE3, RE6, having resistance less than 4 ohms, to provide for some variances in the operation of the bias network. In other words, the voltages at nodes X and Y may be allowed to move further than $V_X + V_{OUT}$ and $V_{OUT} - V_Y$, thereby allowing the bias across the "unused" output transistor to decrease but not the point where the transistor shuts off.

In the example of 100 ma of bias, there will be approximately 0.6 volts across each resistor RE3, RE6 and diode D16, D17, and if this were to decrease to 0.5 volts when the opposite side is conducting large current, the bias is reduced to perhaps only 80 ma for a 0.1 volt deviation in the bias network. This practical improvement makes the $V_{BE}$ and $V_{RE}$ voltage drops across the output stage less critical with respect to bias current and allows some deviation in bias voltage requirements.

Figure 6:
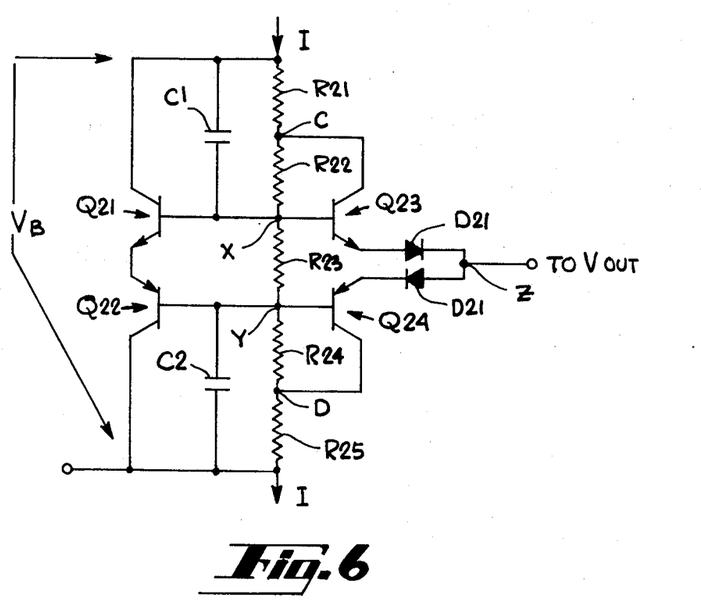
FIG. 6 is a schematic of a preferred improved bias circuit in accord with the teachings of the present invention.

FIG. 6 shows a preferred circuit for generating a bias voltage, $V_B$, within the scope of the present invention. Once again two $V_{BE}$ Multipliers share a common voltage divider resistor. The first $V_{BE}$ Multiplier consists of the bias transistor Q21 with the multiplier resistor R21 and R22 in the base to collector path of the transistor Q21. The second $V_{BE}$ Multiplier consists of the bias transistor Q22 with the multiplier resistors R24 and R25 in the base to collector circuit of that transistor. Both $V_{BE}$ Multipliers share the voltage divider resistor R23. R21 and R25 may preferably be thermistors mounted in contact with output transistors. Q23 and Q24 serve to draw current from the nodes C, D in a manner similar to that explained with reference to FIG. 4, but which allows matching of Q21 to Q23 and Q22 to Q24.

Germanium diodes, D21, provide a small voltage drop, effectively raising the base-emitter voltages of Q23 and Q24 slightly above the base emitter voltages of Q21, Q22, their matched pairs. This insures smaller current flow through Q23 and Q24 than through Q21 and Q22 under quiescent conditions. This configuration exploits the ease with which monolithic matched transistor pair may be obtained. Alternately, D21's could be eliminated and Q23 could be selected to have a higher base to emitter voltage than Q21 and similarly with the base to emitter voltage of Q24 with respect to Q22.

Figure 7:
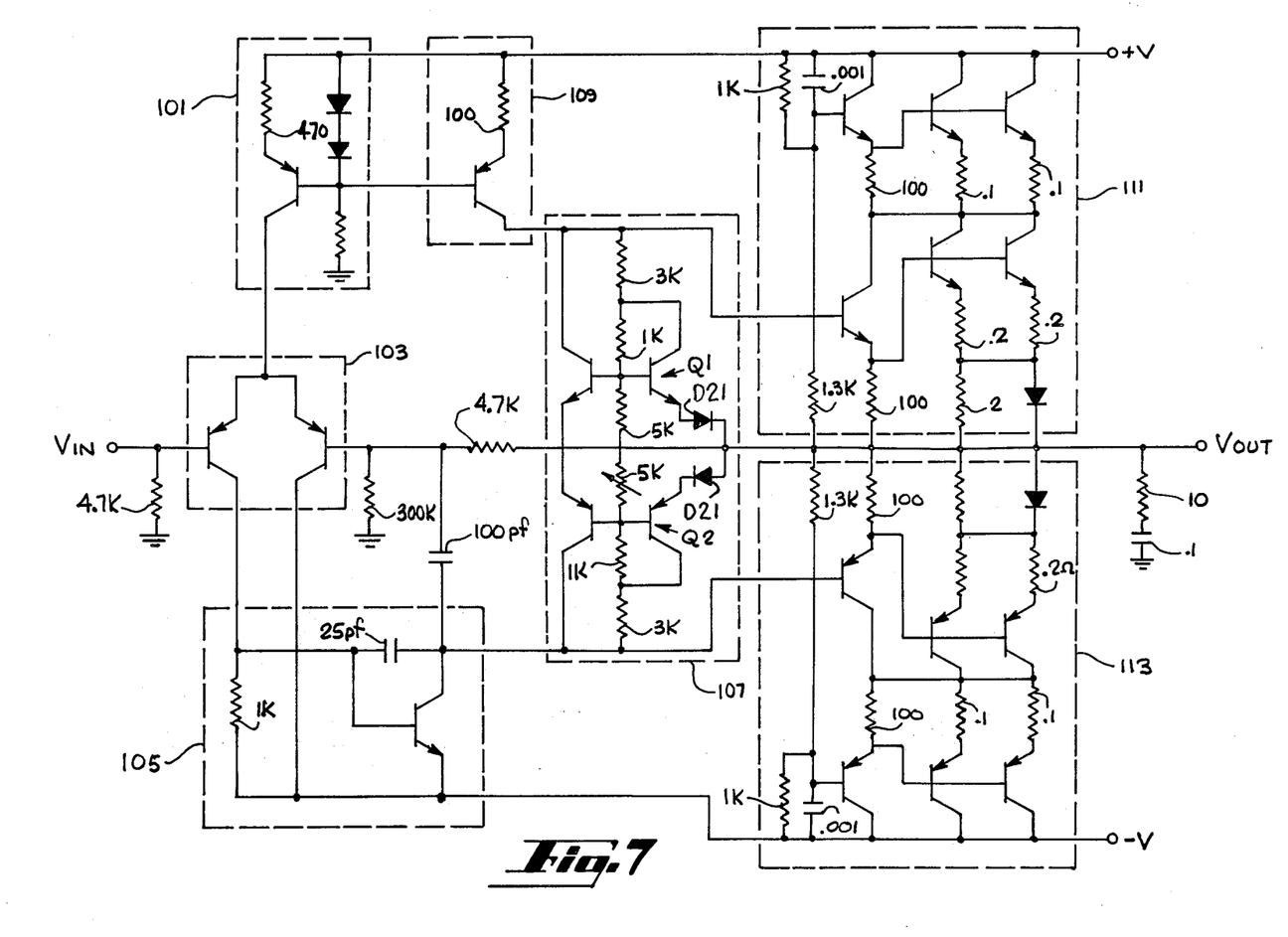
FIG. 7 is a simple 100 watt audio amplifier utilizing complementary symmetry emitter follower transistors with the preferred bias circuit of the present invention.

FIG. 7 shows a simple 100 watt power amplifier with blocks labeled within the figures showing features previously described. A current source 101 feeds the difference amplifier 103. A voltage/current amplifier 105 amplifies the difference signal for input to the complementary output stages 111, 113. Bias for the output stages is provided through the active bias current 107 previous, described above. Current source 109 sources current into the active bias network 107 and the current gains stage 105 sinks current therefrom.

Output node 0 delivers the output signal from the complementary output stages 111, 113 and simultaneously provides feedback to node Z which references the constant voltage sources, the P-N junctions of Q1, Q2, between nodes X and Y on the one hand and node Z on the other, thereby causing current to flow out of or into nodes X and Y for providing proportional bias to the output stages 111, 113 as needed to keep those stages on during all normal signal conditions, as previously explained with reference to FIG. 6.

Figure 8:
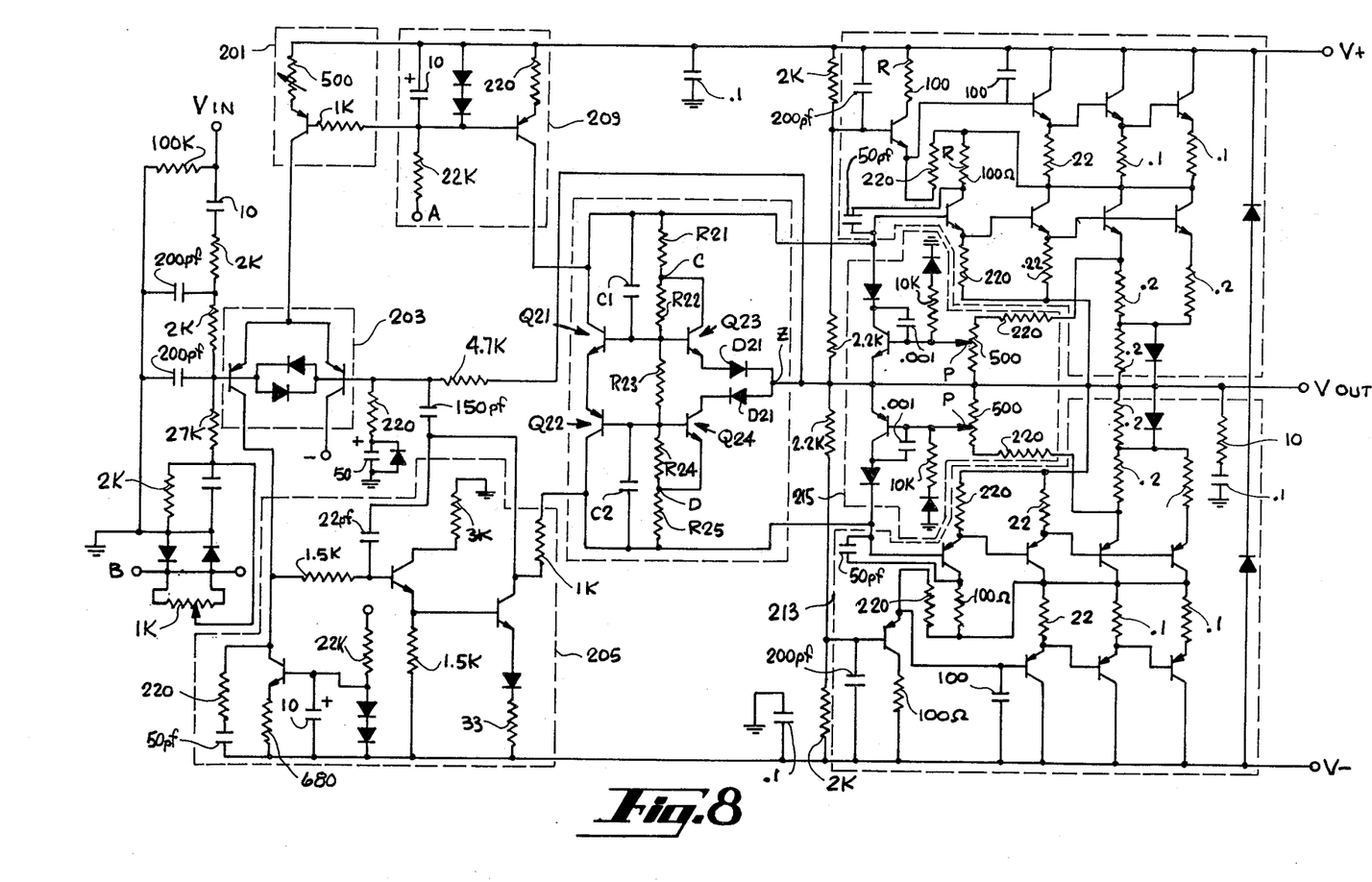
FIG. 8 is a schematic diagram of a 100 watt per channel amplifier utilizing complementary symmetry emitter follower output stages with the bias circuit of the present invention.

FIG. 8 shows a schematic for a 100 watt per channel audio output amplifier utilizing active bias circuit of the present invention. An input signal is received in a differential input amplifier 203 which receives a voltage signal, $V_{IN}$, from the input node I as well as a feedback signal derived from the output node 0, amplifying the differential signal and passing it to a gain stage 205 where the signal is further amplified before transmission to the complementary symmetry emitter output stages 211, 213.

The active bias circuit 207, previously described, has bias feed nodes A and B for feeding bias to the output stages 211, 213. Current sources 201, 209 supply current for development of bias voltages as needed by bias circuit 207.

A newly provided protection circuit 215 is also provided to limit output current if it exceeds a predetermined amount for a given output voltage, as set by the potentiometers P within the protection circuit of the block 215. The bias circuit 207 will be seen to include a variable 5K ohm resistor near node Y. This resistor serves to set the quiescent bias voltage $V_B$.

The apparatus of FIG. 8 operates in much the same way as the apparatus of FIG. 7, inasmuch as the output node O delivers the output signal from the complimentary output stages 211, 213 and provides feedback to node Z of the active bias current 207, which references the constant voltage sources, including the diodes D21, D22, D23, D24, between nodes X and Y on the one hand and node Z on the other, thereby causing current to flow out of or into nodes X and Y for providing proportional bias to the output stage 211, 213 as needed to keep those stages on during normal signal conditions, as previously explained with reference to FIG. 6.

Figure 9:
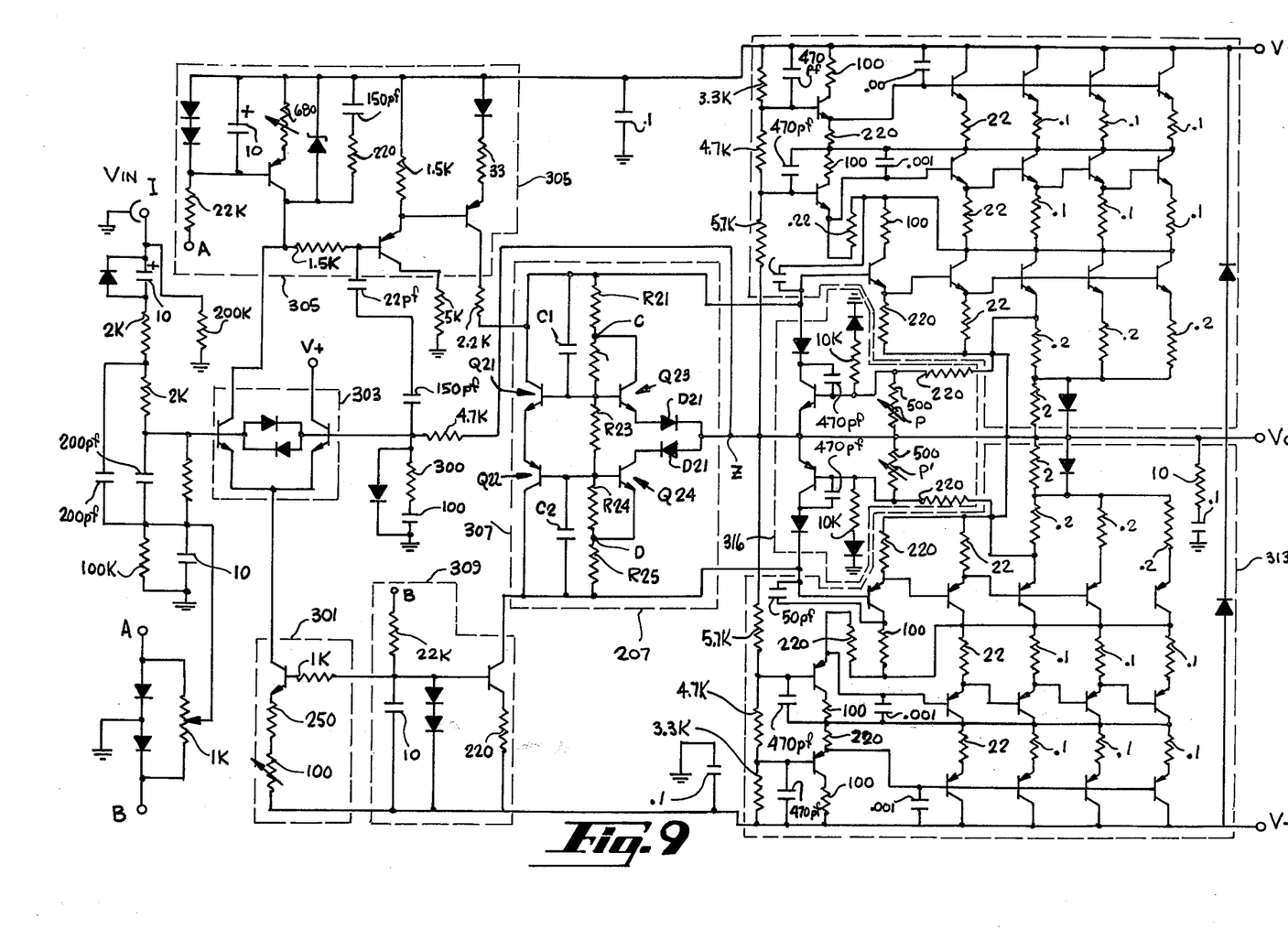
FIG. 9 is a schematic diagram of a 300 watt per channel amplifier utilizing complementary symmetry emitter follower output stages with the bias circuit of the present invention.

FIG. 9 shows a 300 watt version of the apparatus shown in FIG. 8, utilizing an active bias circuit of the present invention. An input signal is received in a differential input amplifier 303 which receives a voltage signal, $V_{IN}$ from input node I as well as a feedback signal derived from the output node O, amplifying the differential signal in passing it to a gain stage 305 where the signal is further amplified before transmission to the complementary symmetry emitter output stages 311, 313.

The active bias circuit 307 has bias feed nodes A and B for feeding bias to the output stages 311, 313. Current sources 301, 309 supply current for development of bias voltages as needed by the bias circuit 307.

Similar to the protection circuit of FIG. 8, the apparatus of FIG. 9 has a protection circuit 315, 316 limiting the output if current exceeds a predetermined amount for a given output voltage as set by the potentiometers P, P' within the blocks 315, 316 respectively. Bias circuit 307 will be seen to include a variable 5K ohm resistor near node Y. This resistor serves to set the quiescent bias voltage $V_B$.

In FIGS. 7, 8 and 9 the values of resistors and capacitors have been indicated next to the component whose value is to be indicated, using conventional electrical schematic notation. These values are exemplary and other values may be selected within tolerances known to those skilled in the art. In selecting components and tolerances, it is to be recalled that the objective is to maintain both complementary symmetry output stages in an "on" condition at all times utilizing the bias circuit provided herein in order to avoid cross-over distortion which has characterized push-pull amplifiers of the prior art.

I claim:

1. A high fidelity audio amplifier comprising, signal input means,
    a power amplifier connected to said signal input means having push-pull, emitter follower, complementary, output transistors, each of said transistors having a base, a collector and an emitter, the emitters of said output transistors communicating with an output node,
    an active bias circuit connected across said complementary output transistors, said active bias circuit including,
    a. first and second series connected $V_{BE}$ Multiplier means for maintaining forward bias on said output transistors at all times under normal operating conditions, and a shared voltage divider resistor therebetween, said resistor terminating in internal voltage reference nodes, and
    b. internal voltage reference means connected between said internal voltage reference nodes and said output node for clamping said internal voltage reference node at a level for maintaining a forward bias on both of said output transistors at all times under normal conditions, and
    output means connected to said output node.

2. The apparatus of claim 1 wherein each $V_{BE}$ Multiplier means comprises,
    a bias transistor having a base, emitter and a collector of complementary polarity with respect to another bias transistor, said bias transistor base connected to a voltage reference node of said voltage divider resistor, and
    a voltage multiplier resistor having a first end connected to a respective voltage reference node and a second end connected to a respective collector of said bias transistor to form a bias feed node at said second end of said multiplier resistor, said bias feed node connected to the base of an output transistor.

3. The apparatus of claim 2 wherein each $V_{BE}$ Multiplier means is connected to said internal voltage reference means, said internal voltage reference means comprising,
    a pair of constant voltage source means each connected between a respective internal voltage reference node and said output node for providing and receiving feedback to and from said output node, said constant voltages source means having a selected voltage drop and polarity for maintaining a bias magnitude, $V_B$, across said pair of bias feed nodes.

4. The apparatus of claim 3 wherein said constant voltage source comprises at least one p-n junction.

5. The apparatus of claim 4 wherein said p-n junction is a diode.

6. The apparatus of claim 4 wherein said p-n junction is a transistor.

7. A high fidelity audio output circuit comprising,
    A. a power amplifier having push-pull, emitter follower, complementary, output transistors, each of said transistors having a base, a collector and an emitter, the emitters of said output transistors being mutually connected at an output node,
    B. a bias circuit comprising,
        first and second series connected $V_{BE}$ Multiplier means for maintaining forward bias on said output transistors at all times, each $V_{BE}$ Multiplier means including
        a bias transistor having a base, emitter and a collector of complementary polarity with reference to the other bias transistor,
        a voltage multiplier resistor having a first end connected to a respective base of a bias transistor and a second end connected to a respective collector of said bias transistor to form a pair of bias feed nodes at said second resistor ends, said bias feed nodes connected to the bases of said output transistors,
        a shared voltage divider resistor having two ends, each end connected to a base of one of said bias transistors to form a pair of internal voltage reference nodes at said two ends and,
        an internal voltage reference means connected between a respective internal voltage reference node and said output node, having a selected voltage drop and polarity for maintaining a bias magnitude, $V_B$, across said pair of bias feed nodes.

* * * * *